US009736958B2

(12) United States Patent
Fu et al.

(10) Patent No.: US 9,736,958 B2
(45) Date of Patent: Aug. 15, 2017

(54) SERVER ASSEMBLY WITH FRONT OPENING

(71) Applicant: Quanta Computer Inc., Taoyuan (TW)

(72) Inventors: Tsung-Chun Fu, Taoyuan (TW); Chao-Jung Chen, Taoyuan (TW); Chen-Chien Kuo, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 14/823,204

(22) Filed: Aug. 11, 2015

(65) Prior Publication Data
US 2016/0128223 A1    May 5, 2016

(30) Foreign Application Priority Data

Nov. 4, 2014    (TW) .............................. 103138218 A

(51) Int. Cl.
| | |
|---|---|
| *H05K 5/00* | (2006.01) |
| *H05K 7/14* | (2006.01) |
| *G11B 25/10* | (2006.01) |
| *G11B 33/12* | (2006.01) |
| *G06F 1/18* | (2006.01) |
| *H05K 7/18* | (2006.01) |

(52) U.S. Cl.
CPC ........... *H05K 7/1487* (2013.01); *G11B 25/10* (2013.01); *G11B 33/128* (2013.01); *H05K 7/1489* (2013.01); *G06F 1/187* (2013.01); *H05K 7/1488* (2013.01); *H05K 7/183* (2013.01)

(58) Field of Classification Search
CPC ........ G06F 3/0689; G06F 1/183; G06F 1/187; G06F 1/1658; G06F 1/181; G06F 1/184; G11B 25/10; G11B 33/128; H05K 7/20809; H05K 7/1489; H05K 7/20736; H05K 7/20818; H05K 7/1487; H05K 7/1488; H05K 7/20772; H05K 7/183
USPC ...... 361/679.01, 679.02, 724–727, 728, 752, 361/679.32–679.39; 312/223.1–223.2
See application file for complete search history.

(56) References Cited

U.S. PATENT DOCUMENTS

| | | | | |
|---|---|---|---|---|
| 7,394,660 | B2 * | 7/2008 | Hidaka ................ | G11B 33/126 361/724 |
| 2014/0265794 | A1 * | 9/2014 | Schroeder ............. | H05K 7/183 312/334.46 |

\* cited by examiner

*Primary Examiner* — Anthony Haughton
*Assistant Examiner* — Ingrid Wright
(74) *Attorney, Agent, or Firm* — Nixon Peabody LLP; Eduardo J. Quinones

(57) ABSTRACT

A server assembly having a housing and a tray mounted in the housing are provided. The tray had a top surface and a front surface, and an open position in which the top surface of the tray is accessible and a closed position in which the top surface of the tray is inaccessible. A first set of chip connections in the top surface can vertically removably receive at least one first storage device. The front surface of the tray can define at least one opening below the top surface configured to horizontally removably receive at least one second storage device. The first set of chip connections electronically couple the at least one first storage device with the server assembly and are inaccessible when the tray is in the closed position, and the openings are accessible regardless of whether the tray is in the open or closed position.

20 Claims, 5 Drawing Sheets

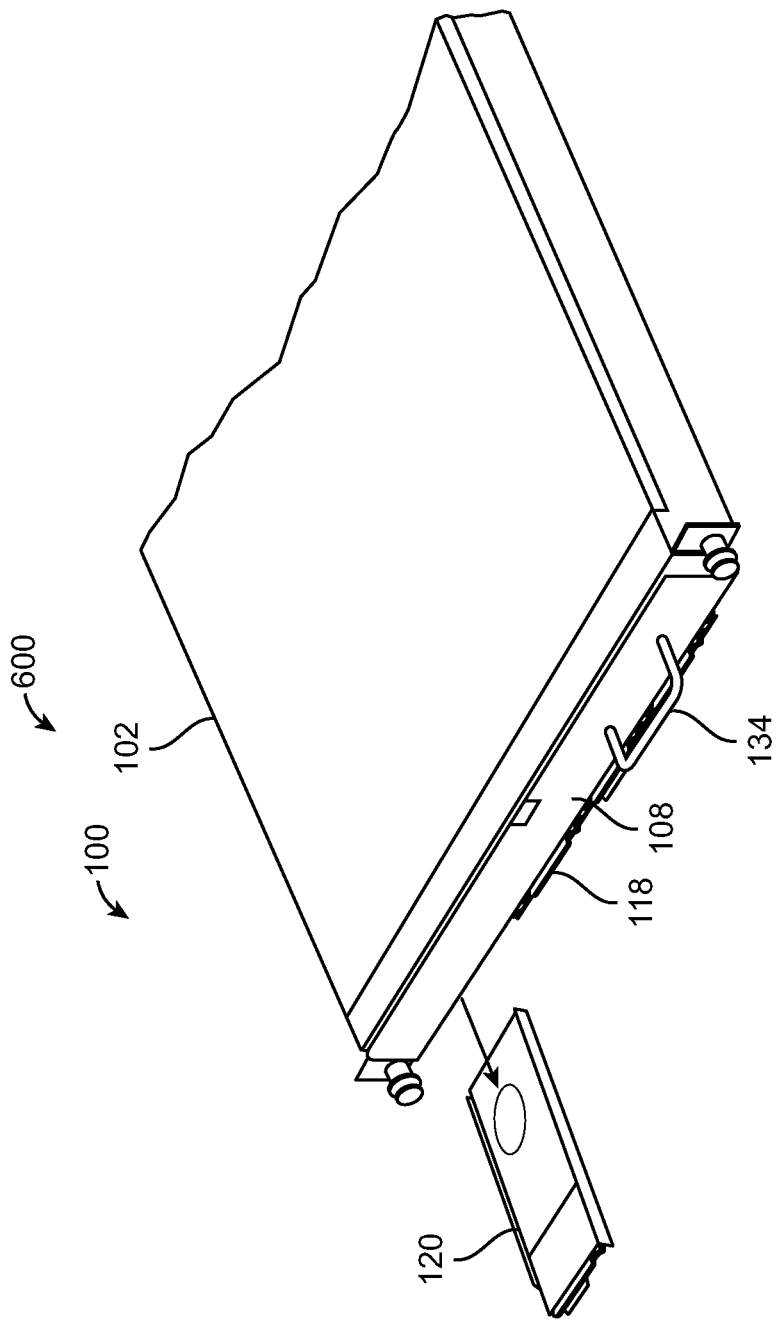

SERVER ASSEMBLY WITH FRONT OPENING

CROSS-REFERENCE TO RELATED APPLICATIONS

This application claims priority to and the benefit of Tawainese Patent Application No. 103138218, filed Nov. 4, 2014, the contents of which are hereby incorporated by reference in their entirety.

FIELD

The subject matter herein generally relates to servers. More specifically, the subject matter herein relates to servers configured to provide front and top access to storage devices.

BACKGROUND

Servers can be stored in server racks having industry standard sizing, known as a rack unit. A rack unit (1U) defines a limited amount of space within which components can be housed and accessed. Servers fitting within 1U can receive one or more storage device. The servers are generally in the form of an insertable tray, such that the tray must be withdrawn from the IU in order to access storage devices within the tray. The storage devices cannot be accessed from the front while the server is withdrawn within the server rack.

BRIEF DESCRIPTION OF THE DRAWINGS

Implementations of the present technology will now be described, by way of example only, with reference to the attached figures, wherein:

FIG. 5 is an isometric view of an example embodiment of a server assembly in a closed position.

DETAILED DESCRIPTION

Figure 1:
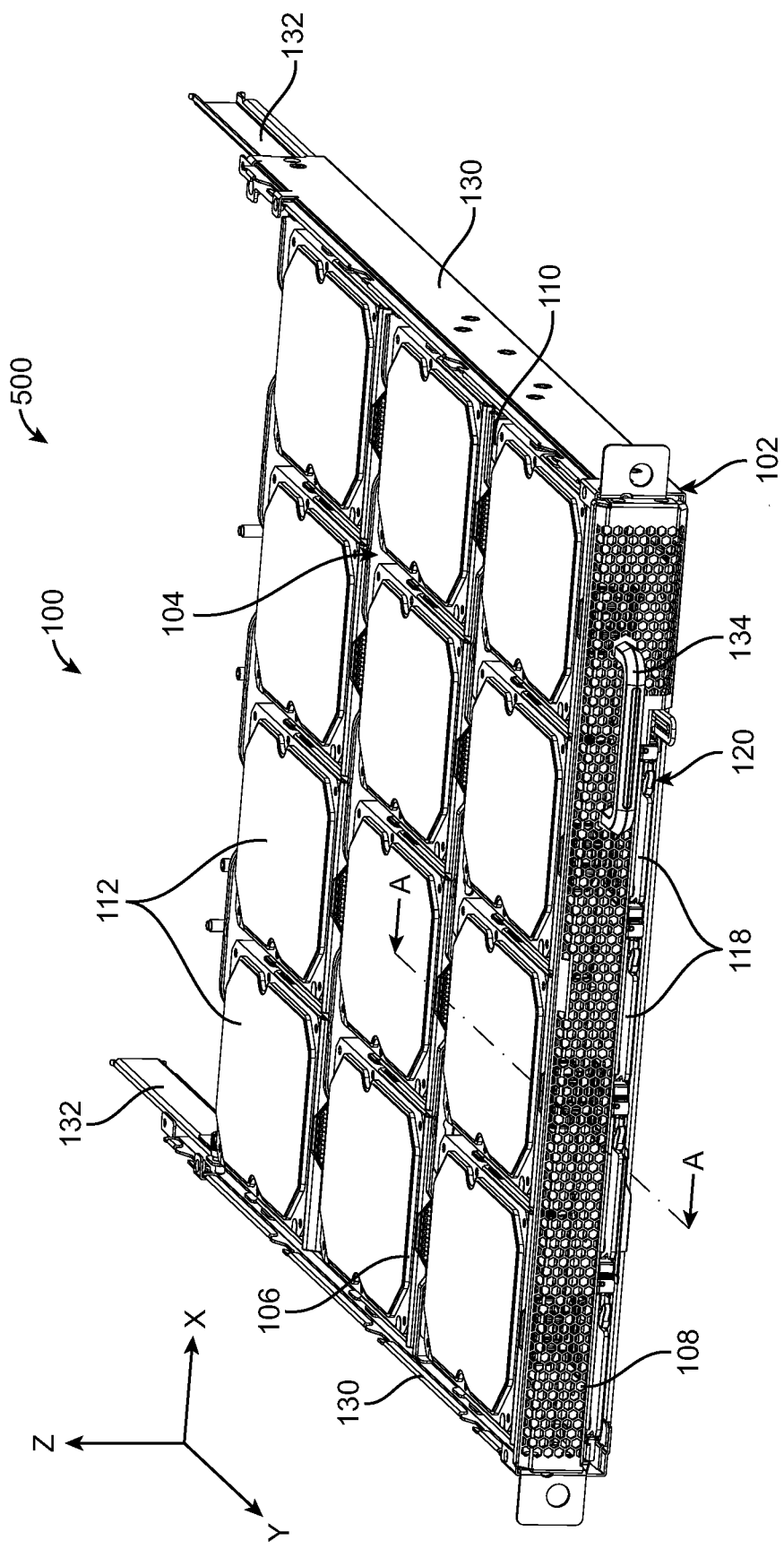
FIG. 1 is an isometric view of an example embodiment of a server assembly in an open position.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

Servers including rack servers, blade servers, and personal servers have become more common place in daily life as the need for data and storage increases with the popularity of the internet and cloud computing and storage.

Embodiments herein relate to a server assembly mountable in a rack unit (1U) and having an open position and a closed position. The server assembly can be configured to receive at least one first storage device when the server is in an open position and at least one second storage device when the server is in the open position or the closed position.

FIG. 1 illustrates an example embodiment of a server assembly. As is known in the art, the server assembly 100 is insertable into in a sever rack assembly (not shown) and can have a height equal to one rack unit (1U), preferably 1.75 inches. In at least one embodiment, the server assembly 100 is insertable in a 1U 19 inch wide server rack assembly. In other embodiments, the server assembly 100 can be insertable in a 1U 24 inch wide server rack assembly. The server assembly 100 can have a housing 102 (shown in FIG. 2) configured to receive a tray 104. The tray 104 can be transitioned between an open position 500 and a closed position 600 (shown in FIG. 5). In the open position 500, the tray 104 can be at least partially removed from the housing 102. In the closed position 600, the tray 104 can be substantially received within the housing 102. See FIG. 5.

In at least one embodiment, the tray 104 is slidably received within the housing 102. The tray 104 can have slide rails 130 formed on opposing sidewalls and configured to slidingly engage with corresponding slide rails 132 formed on opposing sidewalls of the housing 102. In other embodiments, the slide rails 130 can be formed on the bottom of the tray 104 and corresponding slide rails 132 can be formed on the inner surface of the bottom of the housing 102. This arrangement can limit the height of tray 104.

The tray 104 has a top surface 106 and a front surface 108. The top surface 106 of the tray 104 is accessible in the open position 500. The top surface 106 defines individual receiving spaces 110 to each removably receive a first storage device 112. In at least one embodiment, storage device 112 is Hard Disk Drive (HDD).

The tray 104 includes a handle 134 which can be physically used to move the tray between the open position 500 and the closed position 600 (shown in FIG. 5). As can be appreciated in FIG. 1, the handle 134 is substantially U-shaped and secured to the front surface 108 of the tray 104. In other embodiments, the handle 134 can be any suitable shape configured to allow a user or technician to transition the tray 104 between the open position 500 and the closed position 600.

The lower front surface 108 of the tray 104 includes openings 118. Four such openings are shown in the figures, although the invention is not limited to any particular number (including one). Each of openings 118 can removably receive a second storage device 120. Each of the openings 118 is accessible to insert and remove a second storage device 120 regardless of whether the tray 104 is in the open position 500 or the closed position 600. Preferably, the first and second storage devices are different from each other. In at least one embodiment, the second storage device 120 is a Solid State Drive (SSD). In other embodiments, the at least one second storage device 120 is a removable memory card such as Secure Digital (SD), SD High-capacity (SDHC) microSD, and/or Memory Stick (MS).

As can be appreciated in FIG. 1, the plurality of first storage devices 112 are arranged in an array having four rows, each row having three first storage devices 112. The front surface 108 can have four openings 118 formed therein, each configured to receive a second storage device 120. In at least one embodiment, the server assembly 100 can allow each row to function as a Redundant Array of Independent Disks (RAID). The RAID can arranged in one of several ways depending on the specific redundancy and performance required, but can provide protection against unrecoverable sectors, read errors, and whole disk failures. The RAID can distribute data across the first storage devices 112 to provide data redundancy. In another embodiment, a second storage device 120 corresponding to each row can be included in the RAID array. In yet another embodiment, any first storage device 112 and/or second storage device 120 can function in a RAID array irrespective of their row or arrangement depending on the use of the server assembly 100.

Figure 2:
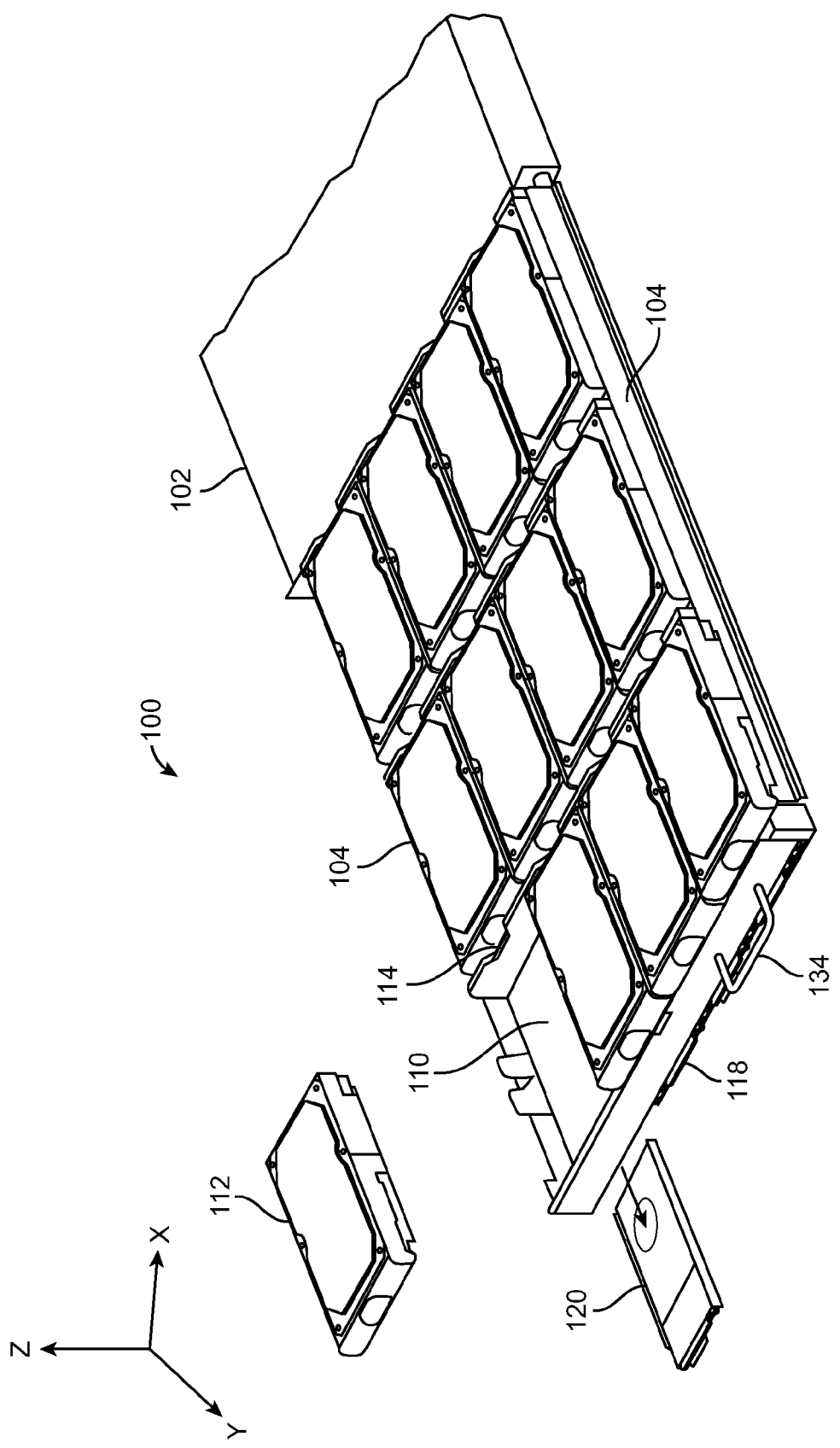
FIG. 2 is an exploded view of an example embodiment of a server assembly in a open position.

FIG. 2 illustrates an example embodiment of a server assembly 100 in an open position 500. The tray 104 further includes a circuit board 114 configured to electronically couple the at least one first storage device 112 and the at least one second storage device 120 with the server assembly 100. In at least one embodiment, the circuit board 114 is a printed circuit board (PCB). In other embodiments, the circuit board 114 can be a flexible circuit board.

As can be appreciated in FIG. 2, the first storage device 112 is substantially vertically received in the receiving space 110 formed by top surface 106 of the tray 104 when the tray is in the open position. Since the first storage devices 112 are within the server rack when in the closed position, they are not accessible when in the closed position.

The first storage device 112 and the circuit board 114 can have a snap fit electrical coupling. In at least one embodiment, the snap fit electrical coupling can be a pin arrangement in which one of the first storage device 112 and the circuit board 114 has a male pin and the other of the storage device 112 and the circuit board 114 has a female pin receiving component. In other embodiments, the first storage device 112 and the circuit board 114 can have any suitable chip connectors that provide electrical coupling including, but not limited to, electrical cabling or optical cabling. Other connections as are known in the art may also be used.

As can further be appreciated in FIG. 2, each second storage device 120 can be horizontally inserted in and removed from the opening 118 in the front surface 108 of the tray 104. The front surface 108 and opening 118 are accessible regardless of whether the tray 104 is in the open or closed position, and thus the second storage device 120 can be inserted and removed from the server assembly 100 when the tray 104 is in either the open position 500 or the closed position 600 (shown in FIG. 5). In at least one embodiment, the second storage device 120 is ejectable.

Figure 3:
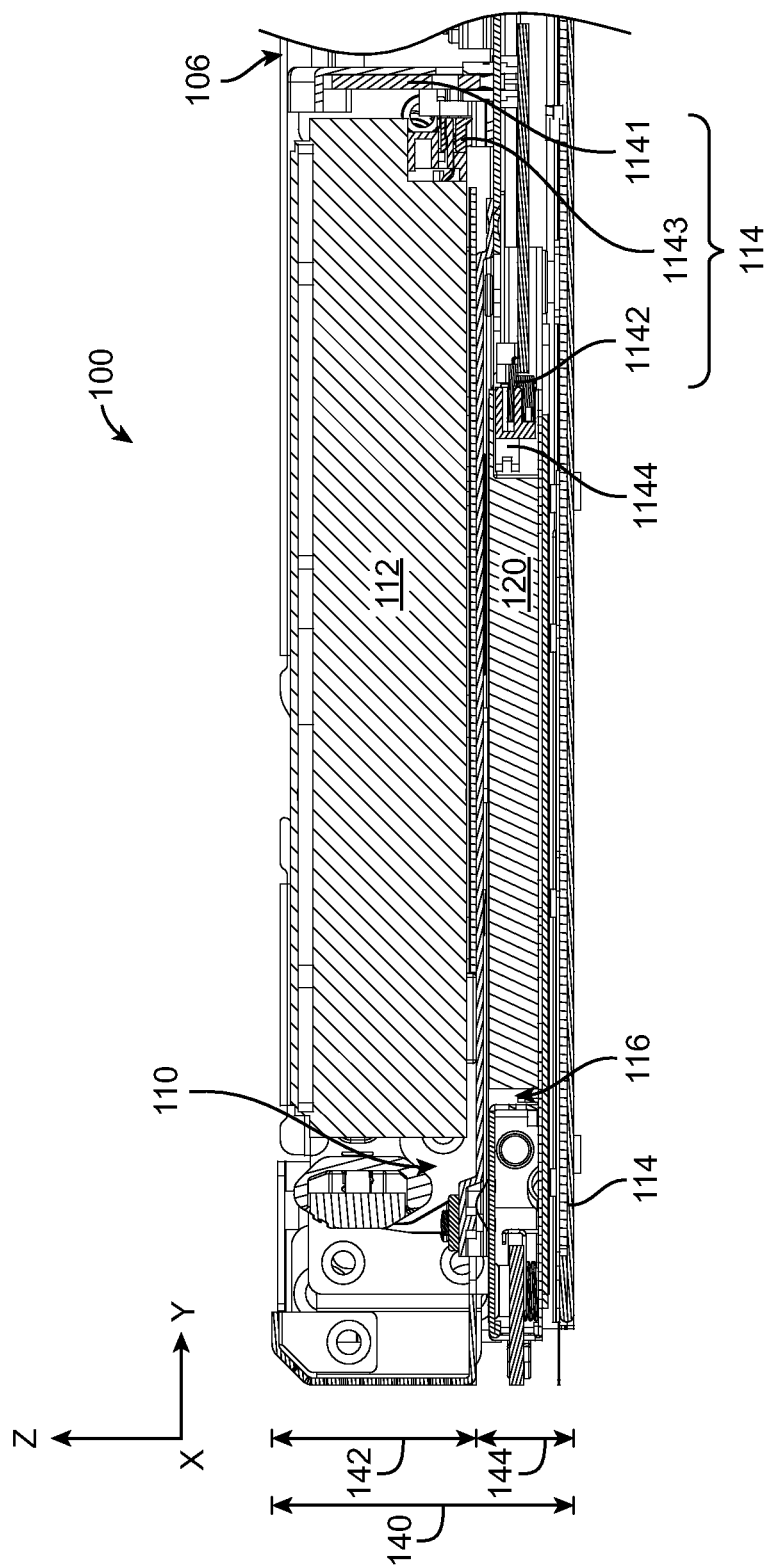
FIG. 3 is an cross-section view of an example embodiment of a server assembly taken along line A-A of FIG. 1.
Figure 4:
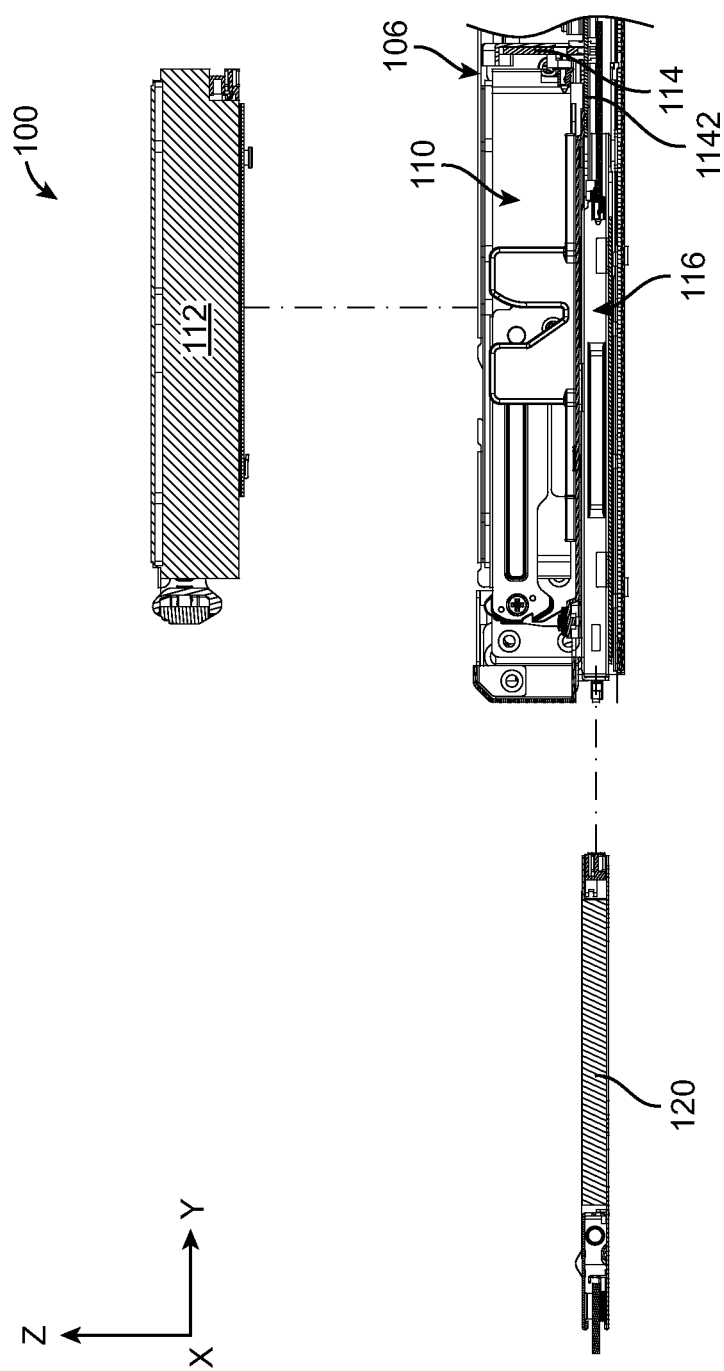
FIG. 4 is a side exploded elevational view of an example embodiment of a server assembly.

FIG. 3 illustrates a cross-sectional view of an example embodiment of the server assembly 100 of FIG. 1. FIG. 4 illustrates an exploded cross-section view of an example embodiment the server assembly of FIG. 3. The circuit board 114 disposed within the tray can have a first circuit board 1141 configured to electronically couple the first storage device 112 and a second circuit board 1142 configured to electronically couple a second storage device 120. The first circuit board 1141 having a first interface 1143 and the second circuit board 1142 having a second interface 1144. Each interface 1143, 1144 configured to electronically and communicatively couple the at least one first storage device 112 and at least one second storage device 120 to the server assembly 100.

In an illustrated embodiment, each row of first storage devices 112 electrically couples to a separate first circuit board 1141 and each at least one second storage device 120 electrically couples to a separate second circuit board 1142. In other embodiments, each first storage device 112 electronically couples to one first circuit board 1141 and each second storage device electronically couples to one second circuit board 1142. The first interface 1143 configured to communicatively couple with the at least one first storage device 112 and the second interface 1144 configured to communicatively couple with at least one second storage device 120. In at least one embodiment, the first interface 1143 and the second interface 1144 are similar arrangements, such as male/female pin connectors. In other embodiments, the first interface 1143 and the second interface 1144 are different arrangements, such as male/female pin connectors, optical couplers, contact couplers, or a combination thereof.

As can be appreciated in FIGS. 3 and 4, an accommodating space 116 is formed within the housing 102 and below the tray 104. The opening 118 in the front surface 108 can receive the at least one second storage device 120 in the accommodating space 116. The accommodating space 116 is formed by a gap between the bottom surface of the tray 104 and bottom surface of the housing 102.

As can further be appreciated in FIGS. 3 and 4, the server assembly 100 can have a height 140 that can be equal to 1U. The receiving space 110 having a height 142 and the accommodating space 116 having a height 144. The height 142 of the receiving space 110 greater than or equal to the height of the at least one first storage device 112. The height 144 of the accommodating space 116 greater than or equal to the height of the at least one second device 120.

In at least one embodiment, the height 142 of the receiving space 110 is greater than the height 144 of the accommodating space 116. In another embodiment, the height 144 of the accommodating space 116 can be greater than the height 142 of the receiving space 110. In at least one embodiment, the at least one first storage device 112 is thicker (in the Z-direction) than the at least one second storage device 120.

FIG. 5 illustrates an example embodiment of a server assembly in closed position. In the closed position 600, the tray 104 is substantially received within the housing 102. The front surface 108 and the at least one opening 118 are accessible in the closed position 600. The second storage device 120 can be inserted in and removed from the at server assembly 100 while in the closed position 600. The top surface 106 is inaccessible in the closed position 600; therefore, any first storage device 112 is also inaccessible in the closed position 600. The handle 134 allows a user or technician to transition the server assembly between the closed position 600 and the open position 500 (shown in FIG. 1).

It is believed the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiments of the disclosure.

What is claimed is:

1. A server assembly comprising:
    a housing;
    a tray mounted in the housing, having a receiving space and a front surface, and having an open position in which the receiving space of the tray is accessible and a closed position in which the receiving space of the tray is inaccessible;
    a first set of chip connections in the receiving space configured to vertically receive and remove at least one first storage device; and
    the front surface of the tray defining at least one opening below the receiving space configured to horizontally receive and remove at least one second storage device;
    wherein the first set of chip connections are configured to electronically couple the at least one first storage device with the server assembly and are inaccessible when the tray is in the closed position, and the at least one opening in the front surface is accessible regardless of whether the tray is in the open or closed position.

2. The server assembly of claim 1, wherein a second set of chip connections electronically couples the at least one second storage device to the server assembly.

3. The server assembly of claim 1, wherein the at least one first storage device configured to be received by the first set of chip connections is a hard disk drive (HDD).

4. The server assembly of claim 1, wherein the at least one second storage device configured to be received by the openings in the front surface of the tray is a solid-state drive (SSD).

5. The server assembly of claim 1, further comprising an accommodating space, below the first set of chip connections, configured to receive the at least one second storage device.

6. The server assembly of claim 5, wherein the accommodating space is formed by a bottom of the tray and the housing.

7. The server assembly of claim 1, wherein the at least one second storage device is ejectable from the at least one opening in the front surface of the tray.

8. The server assembly of claim 1, wherein the server assembly is configured to be mounted in a rack unit (1U) server rack assembly.

9. A server assembly comprising:
    a housing;
    a tray mounted in the housing, having a receiving space and a front surface, and having an open position in which the receiving space of the tray is accessible and a closed position in which the receiving space of the tray is inaccessible;
    a first set of chip connections in the receiving space having at least one first storage device vertically received therein; and
    the front surface of the tray defining openings below the receiving space configured to horizontally receive and remove at least one second storage device;
    wherein the first set of chip connections electronically couple the at least one first storage device with the server assembly and are inaccessible when the tray is in the closed position, and the at least one opening in the front surface is accessible regardless of whether the tray is in the open or closed position.

10. The server assembly of claim 9, wherein a second set of chip connections electronically couples the at least one second storage device to the server assembly.

11. The server assembly of claim 9, wherein the at least one first storage device received by the first set of chip connections is a hard disk drive (HDD).

12. The server assembly of claim 9, wherein the at least one second storage device configured to be received by the openings in the front surface of the tray is a solid-state drive (SSD).

13. The server assembly of claim 9, further comprising an accommodating space below the first set of chip connections, configured to receive the at least one first storage device.

14. The server assembly of claim 13, wherein the accommodating space is formed by a bottom of the tray and the housing.

15. The server assembly of claim 9, wherein the at least one second storage device is ejectable from the at least one opening in the front surface of the tray.

16. The server assembly of claim 9, wherein the server assembly is configured to be mounted in a rack unit (1U) server rack assembly.

17. A server assembly comprising:
    a housing;
    a tray mounted in the housing, having a receiving space and a front surface, and having an open position in which the receiving space of the tray is accessible and a closed position in which the receiving space of the tray is inaccessible;
    a first set of chip connections in the receiving space having at least one first storage device vertically received therein; and
    the front surface of the tray defining openings below the receiving space having at least one second storage device horizontally received therein and below the bottom surface of the at least one first storage device;
    wherein the first set of chip connections electronically couple the at least one first storage device with the server assembly and are inaccessible when the tray is in the closed position, and the at least one opening in the front surface is accessible regardless of whether the tray is in the open or closed position;
    wherein the at least one first storage device configured to be received by the first set of chip connections is a hard disk drive (HDD);
    wherein the at least one second storage device configured to be received by the openings in the front surface of the tray is a solid-state drive (SSD).

18. The server assembly of claim 17, wherein the at least one second storage device is ejectable from the at least one opening in the front surface of the tray.

19. The server assembly of claim 17, wherein the server assembly is configured to be mounted in a rack unit (1U) server rack assembly.

20. The server assembly of claim 17, wherein the server assembly has an accommodating space formed by the bottom of the tray and the housing and the at least one second storage device is configured to be received within the accommodating space.

* * * * *